US006919266B2

United States Patent
Ahn et al.

(10) Patent No.: US 6,919,266 B2
(45) Date of Patent: Jul. 19, 2005

(54) COPPER TECHNOLOGY FOR ULSI METALLIZATION

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/910,914

(22) Filed: Jul. 24, 2001

(65) Prior Publication Data

US 2003/0020180 A1 Jan. 30, 2003

(51) Int. Cl.⁷ .................. H01L 21/283; H01L 21/768
(52) U.S. Cl. .................. 438/623; 438/627; 438/626; 438/633; 438/638; 438/677
(58) Field of Search .................. 438/623, 627, 438/626, 633, 638, 677, FOR 355

(56) References Cited

U.S. PATENT DOCUMENTS

| | | | | |
|---|---|---|---|---|
| 5,451,551 A | * | 9/1995 | Krishnan et al. | 438/626 |
| 6,010,962 A | * | 1/2000 | Liu et al. | 438/687 |
| 6,040,243 A | * | 3/2000 | Li et al. | 438/687 |
| 6,110,648 A | * | 8/2000 | Jang | 430/312 |
| 6,297,158 B1 | * | 10/2001 | Liu et al. | 438/687 |
| 6,313,028 B2 | * | 11/2001 | Huang et al. | 438/637 |
| 6,352,938 B2 | * | 3/2002 | Chen et al. | 134/1.1 |
| 6,368,954 B1 | * | 4/2002 | Lopatin et al. | 438/627 |
| 6,380,083 B1 | * | 4/2002 | Gross | 438/622 |
| 6,395,632 B1 | | 5/2002 | Farrar | |
| 6,498,090 B2 | | 12/2002 | Morozumi | |
| 6,531,777 B1 | | 3/2003 | Woo et al. | |
| 2001/0036739 A1 | * | 11/2001 | Cook et al. | 438/700 |
| 2002/0009880 A1 | * | 1/2002 | Jiang et al. | 438/643 |
| 2002/0048931 A1 | * | 4/2002 | Farrar | 438/622 |

OTHER PUBLICATIONS

"Current and Future Low–k Dielectrics for Cu Interconnects" by Takamaro Kikkawa, 2000 IEEE, pp. 253–256.
"Atomic Layer Deposition of Tungsten Nitride Films Using Sequential Surface Reactions" by J.W. Klaus, et al, Journal of The Electrochemical Society, 2000, pp. 1175–1181.
"Copper electroless deposition technology of ultra–large–scale–integration (ULSI) metallization" by Yosi Shacham–Diamond, et al., Elsevier Science, 1997, pp. 47–58.
"Blanket and Selective Cooper CVD From Cu(FOD)2 for Multilevel Metallization" by Alain E. Kaloyeros, et al, Materials Research Society, vol. 181, 1990, pp. 79–84.

* cited by examiner

Primary Examiner—George Fourson
(74) Attorney, Agent, or Firm—Dickstein Shapiro Morin & Oshinsky LLP

(57) ABSTRACT

A copper damascene structure formed by direct patterning of a low-dielectric constant material is disclosed. The copper damascene structure includes a tungsten nitride barrier layer formed by atomic layer deposition using sequential deposition reactions. Copper is selectively deposited by a CVD process and/or by an electroless deposition technique.

28 Claims, 9 Drawing Sheets

COPPER TECHNOLOGY FOR ULSI METALLIZATION

FIELD OF THE INVENTION

The present invention relates to the field of semiconductors and, in particular, to a method of forming damascene structures in semiconductor devices.

BACKGROUND OF THE INVENTION

In an attempt to improve the performance, reliability and density of fully integrated ULSI (ultra-large scale integration) interconnects, the microelectronics industry has recently begun migrating away from the use of aluminum (Al) and/or its alloys for the ULSI interconnects. As such, advanced dual damascene processes have begun using copper (Cu) as the material of choice because copper has high conductivity, extremely low resistivity (about 1.7 $\mu\Omega$cm) and good resistance to electromigration. Unfortunately, copper diffuses rapidly through silicon dioxide ($SiO_2$) or other interlayer dielectrics, such as polyimides and parylenes, and copper diffusion can destroy active devices, such as transistors and capacitors, formed in the IC substrate. In addition, metal adhesion to the underlying substrate materials must be excellent to form reliable interconnect structures but the adhesion of copper to interlayer dielectrics, particularly to $SiO_2$, is generally poor.

Another problem associated with dual damascene processing is the cost and complexity of the process. Advanced copper dual damascene processes include a two-step sequential mask/etch process to form a two-level structure, such as a via connected to a metal line situated above the via. As illustrated in FIG. 1, a known copper dual damascene process as applied to interconnect formation begins with the deposition of a first insulating layer 14 over a first level interconnect copper layer 12, which in turn is formed over or within a semiconductor substrate 10. A second insulating layer 16 is next formed over the first insulating layer 14. An etch stop layer 15 is typically formed between the first and second insulating layers 14, 16. The second insulating layer 16 is patterned by photolithography with a first mask (not shown) to form a trench 17 corresponding to a copper line of a second level interconnect. The etch stop layer 15 prevents the upper level trench pattern 17 from being etched through the first insulating layer 14.

As illustrated in FIG. 2, a second masking step followed by an etch step are applied to form a via 18 through the etch stop layer 15 and the first insulating layer 14. After the etching is completed, both the trench 17 and the via 18 are filled with copper material 20, as illustrated in FIG. 3. Typically, the copper material 20 undergoes a chemical mechanical polishing (CMP) step to remove any copper material from above the second insulating layer 16 and to form, therefore, a copper damascene structure as illustrated in FIG. 4. The CMP step leaves the copper damascene structure 25 with a copper planarized surface for subsequent metallization to build multi-level interconnects.

If desired, a second etch stop layer (not shown) may be formed between the substrate 10 and the first insulating layer 14 during the formation of the copper damascene structure 25. In any event, and in contrast to a single damascene process, the via and the trench are simultaneously filled with metal. Thus, although copper dual damascene process is more advantageous over the copper single damascene process, one big disadvantage remains the high number of sequential photoresist/mask/etch steps and etch-stop layers which, as described above, are conventionally used in damascene processing and which increase the fabrication cost and reduce the production yield. Another disadvantage is that copper deposition methods for conventional damascene processes employ a large amount of high-purity copper material, of which a considerable amount is removed and wasted by the CMP process described above with reference to FIGS. 3–4. Thus, even the dual damascene processing is very expensive and entails a large number of processing steps.

Accordingly, there is a need for an improved and simplified copper damascene process which reduces production costs and increases productivity. There is also a need for a method of increasing the adhesion of copper to underlying damascene layers as well as a method of decreasing copper diffusion in such layers.

SUMMARY OF THE INVENTION

The present invention provides a method for fabricating a copper interconnect structure in a semiconductor device which requires fewer processing steps and reduces the diffusion of copper atoms to underlying damascene layers.

In an exemplary embodiment, trenches and vias are formed by direct patterning of a low-dielectric constant material, subsequent to which a thin tungsten nitride ($WN_2$) diffusion barrier layer is formed by an atomic layer deposition using sequential surface reactions inside the trenches and vias. A selective copper CVD process is used to fill in the trenches and vias with copper. In another exemplary embodiment, an electroless deposition technique is employed in lieu of the selective copper CVD process. This way, the sequential photoresist/mask/etch steps and the etch-stop layers are eliminated, while the diffusion of copper atoms into adjacent interconnect layers is suppressed.

Additional advantages of the present invention will be more apparent from the detailed description and accompanying drawings, which illustrate preferred embodiments of the invention.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, electrical and process changes may be made without departing from the spirit or scope of the present invention.

The term "substrate" used in the following description may include any semiconductor-based structure that has a semiconductor surface. The term should be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a "substrate" in the following description, previous process steps may have been utilized to form regions or junctions in or on the base semiconductor or foundation.

The term "copper" is intended to include not only elemental copper, but also copper with other trace metals or in various alloyed combinations with other metals as known in the art, as long as such alloy retains the physical and chemical properties of copper. The term "copper" is also intended to include conductive oxides of copper.

Figure 1:
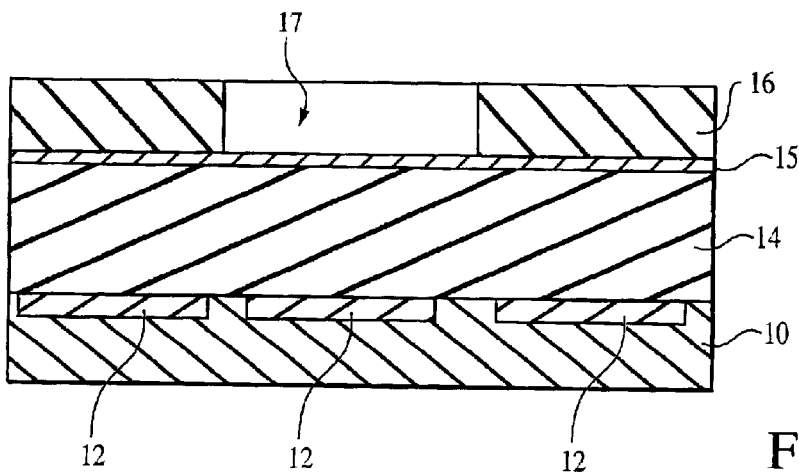
FIG. 1 is a cross-sectional view of a conventional semiconductor device at a preliminary stage of production.
Figure 2:
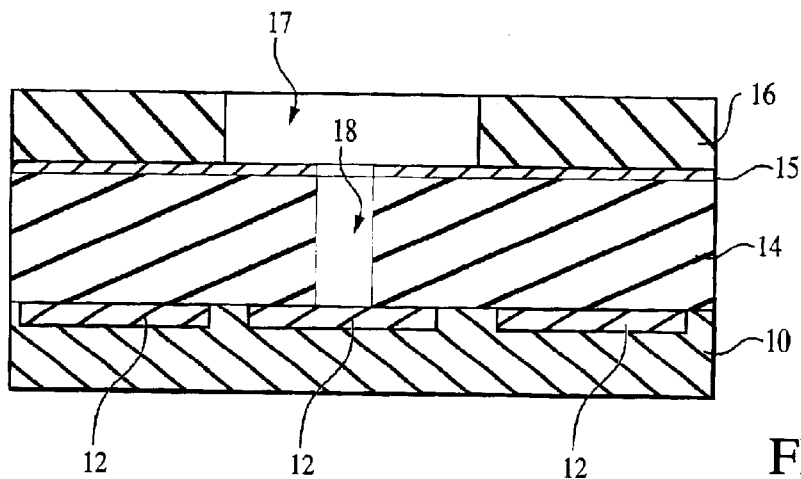
FIG. 2 is a cross-sectional view of the semiconductor device of FIG. 1 at a subsequent stage of production.
Figure 3:
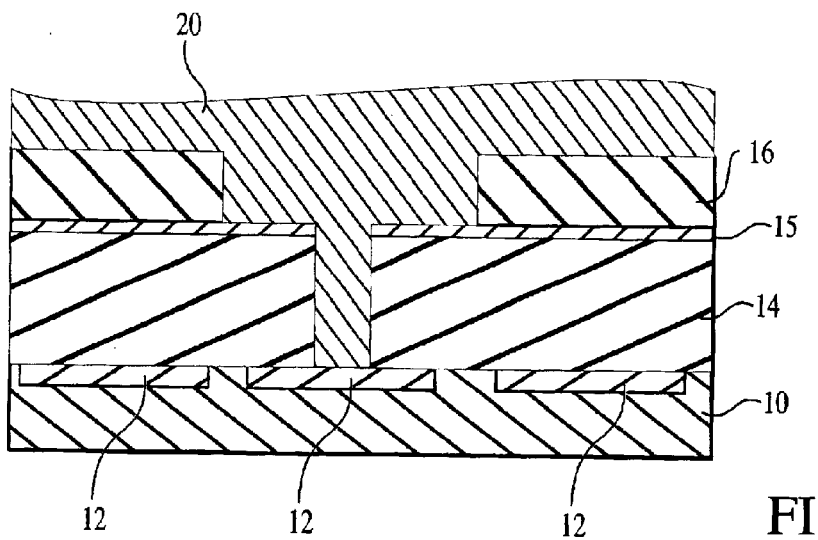
FIG. 3 is a cross-sectional view of the semiconductor device of FIG. 2 at a subsequent stage of production.
Figure 4:
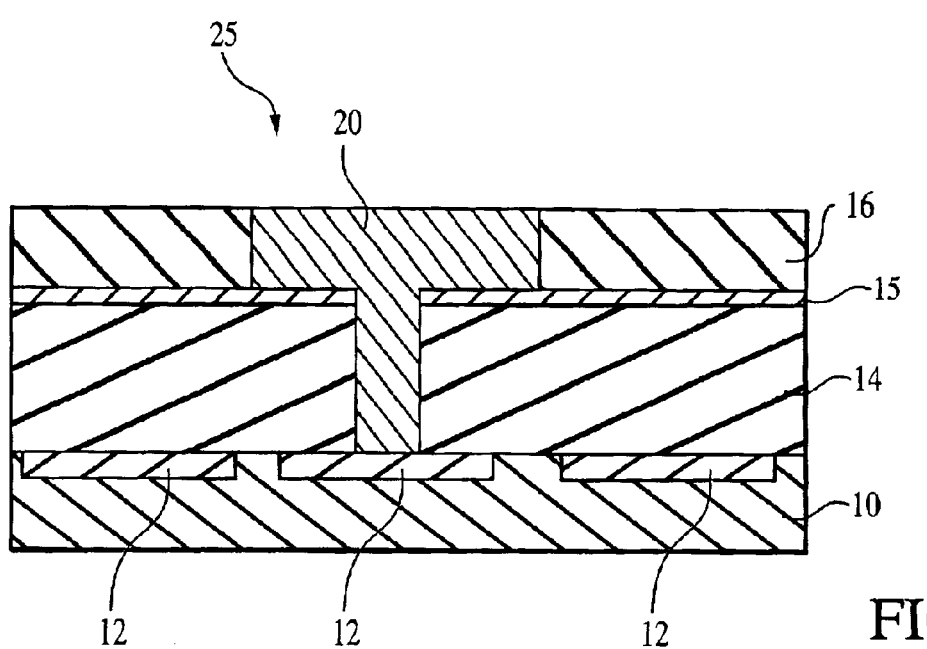
FIG. 4 is a cross-sectional view of the semiconductor device of FIG. 3 at a subsequent stage of production.
Figure 5:
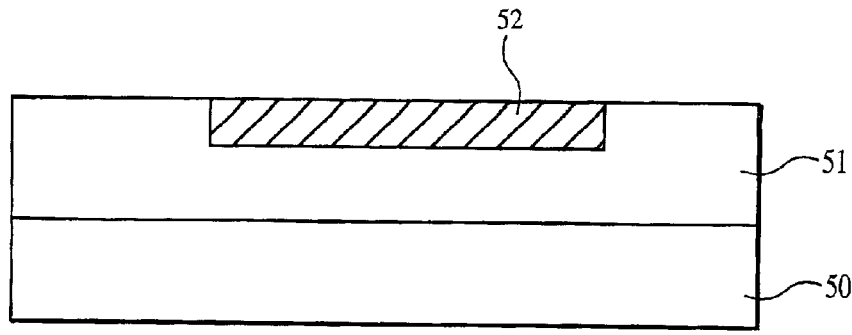
FIG. 5 is a cross-sectional view of a semiconductor device at a preliminary stage of production and in accordance with a first embodiment of the present invention.

Referring now to the drawings, where like elements are designated by like reference numerals, FIGS. 5–17 illustrate the formation of copper damascene structures 100, 200, 300 (FIGS. 14, 16, 17) formed in accordance with exemplary embodiments of the present invention. FIG. 5 depicts a portion of an insulating layer 51 formed over a semiconductor substrate 50, on or within which a metal layer 52 has been formed. The metal layer 52 represents a lower metal interconnect layer which is to be later interconnected with an upper copper interconnect layer. The metal layer 52 may be formed of copper (Cu), but other conductive materials, such as tungsten (W) or aluminum (Al) and their alloys, may be used also.

Figure 6:
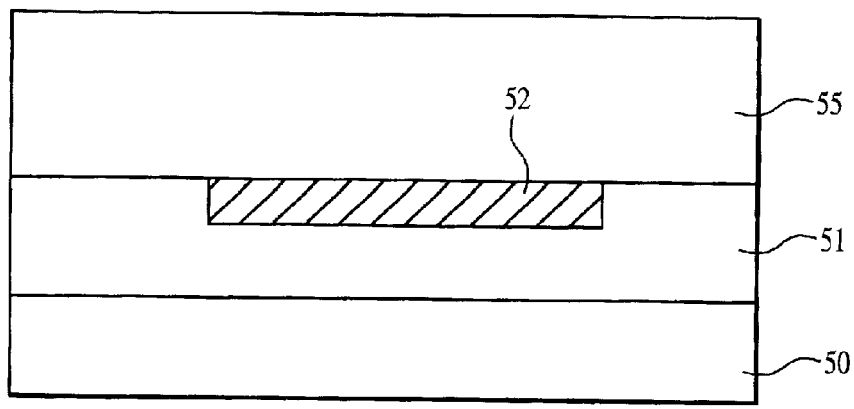
FIG. 6 is a cross-sectional view of the semiconductor device of FIG. 5 at a subsequent stage of production.

Referring now to FIG. 6, an intermetal dielectric layer 55 is formed overlying the insulating layer 51 and the metal layer 52. In an exemplary embodiment of the present invention, the intermetal dielectric layer 55 is formed of a low-dielectric constant material to a thickness of about 2,000 Angstroms to 50,000 Angstroms, more preferably of about 5,000 Angstroms to 20,000 Angstroms. For the purposes of the present invention, a low-dielectric constant material is a material with a dielectric constant of less than about 4.

In a preferred embodiment of the invention, the intermetal dielectric layer 55 is a low-dielectric constant material which can be directly patterned, without using a photoresist material, and which may be formed by a method described by Kikkawa in *Current and Future Low-k Dielectrics for Cu Interconnects,* Technical Digests of IEDM, pp. 253–56 (2000), the disclosure of which is incorporated by reference herein. Kikkawa has demonstrated that fabrication of photoresistive low-dielectric constant films, such as methylsilsesquiazane (MSZ) films, can eliminate photoresist coating, dry etching and etch stop layers. According to recent experiments conducted by Kikkawa, vias and/or holes are formed in methylsilsesquiazane (MSZ) films by direct patterning, such as direct EB (electron beam) or UV (ultra violet) lithography, without using photoresist or dry etching.

According to the experiments conducted by Kikkawa, a methylsilsesquiazane (MSZ) film precursor is deposited on a silicon substrate by spin-coating at 2700 rpm and pre-baked at about 90° C. for about 10 minutes. EB lithography is subsequently carried out with doses of about $3\ \mu C/cm^2$ to about $123\ \mu C/cm^2$. Alternatively, UV (I-line) lithography is carried out with doses of about $45\ mJ/cm^2$ to about $315\ mJ/cm^2$. For either the UV or the EB lithography, moisture absorption is conducted at 25° C. and 50% relative humidity for about 10 minutes. Development of the methylsilsesquiazane (MSZ) film is then carried out in a tetra-methyl-ammonium hydroxide (TMAH) solution.

If UV lithography is employed, the methylsilsesquiazane (MSZ) film undergoes curing at 400° C. in a nitrogen ambient to be subsequently transformed into a methylsilsesquioxane (MSQ) film. Kikkawa et al. have observed that, during curing at 400° C. in the nitrogen ambient, the methylsilsesquiazane (MSZ) film undergoes photochemical reactions so that the resulting methylsilsesquioxane (MSQ) film comprises no Si—N bonds and only Si—O and Si—$CH_3$ bonds.

Although low-dielectric constant materials such as the methylsilsesquiazane (MSZ) films are preferred, the present invention is not limited to these materials. Thus, the intermetal dielectric layer 55 may be also formed of a conventional insulating oxide, such as silicon oxide ($SiO_2$), or other low-dielectric constant materials such as, for example, polyimide, spin-on-polymers (SOP), parylene, flare, polyarylethers, polytetrafluoroethylene, benzocyclobutene (BCB), SILK, fluorinated silicon oxide (FSG), NANO-GLASS or hydrogen silsesquioxane, which have dielectric constants of less than about 4.

Figure 7:
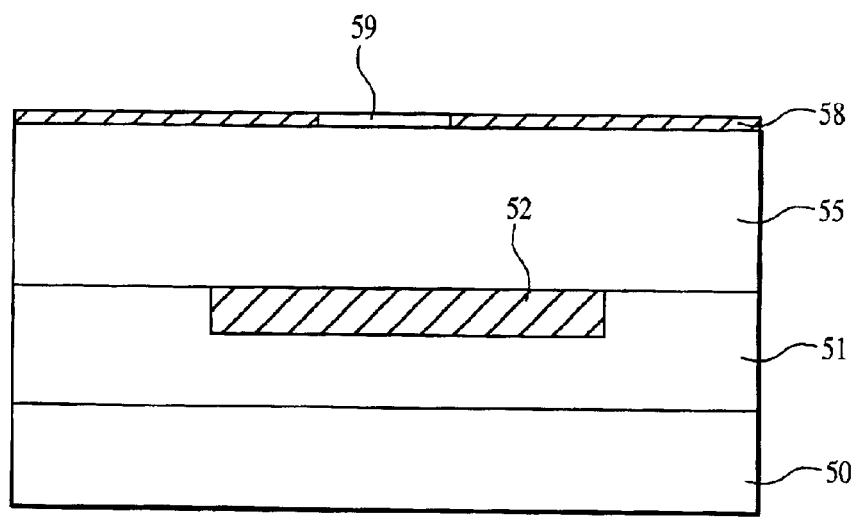
FIG. 7 is a cross-sectional view of the semiconductor device of FIG. 5 at a subsequent stage of production.
Figure 8:
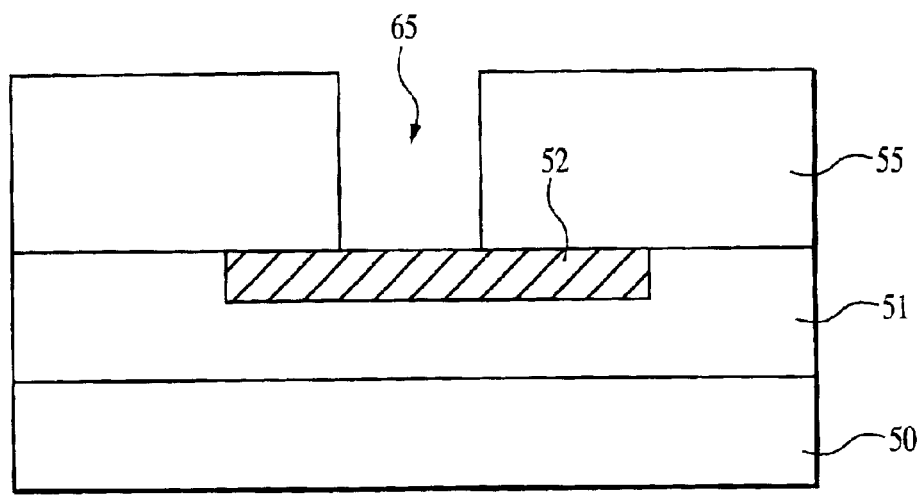
FIG. 8 is a cross-sectional view of the semiconductor device of FIG. 5 at a subsequent stage of production.
Figure 9:
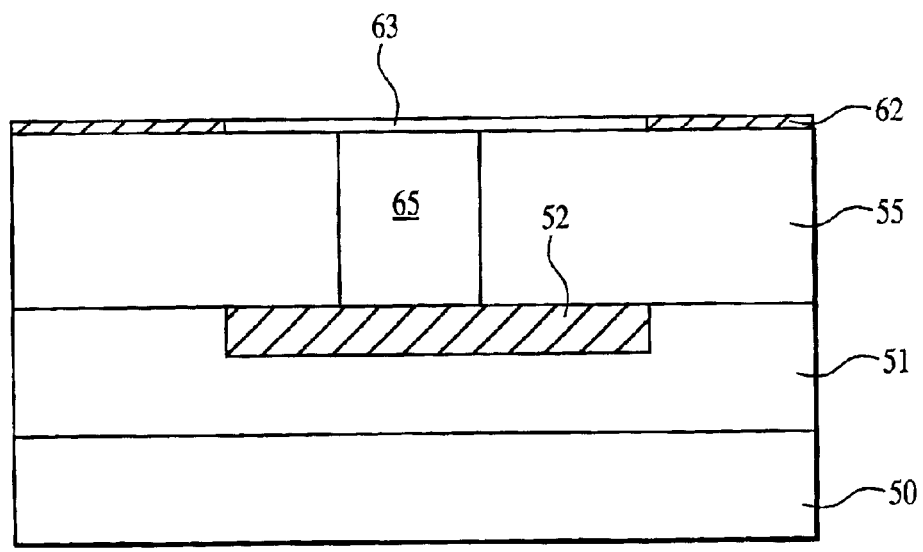
FIG. 9 is a cross-sectional view of the semiconductor device of FIG. 5 at a subsequent stage of production.

Next, as illustrated in FIG. 7, a first mask layer 58 having images of a via pattern 59 is formed over the intermetal dielectric layer 55 for direct patterning. Thus, as shown in FIG. 8, a via 65 may be formed by etching through the intermetal dielectric layer 55 with an etchant. The etchant (not shown) may be selected in accordance with the characteristics of the intermetal dielectric layer 55, so that the dielectric material is selectively etched until the etchant reaches the metal layer 52. As noted above, and according to a preferred embodiment, the etchant is a tetra-methyl-ammonium hydroxide (TMAH) solution.

Figure 10:
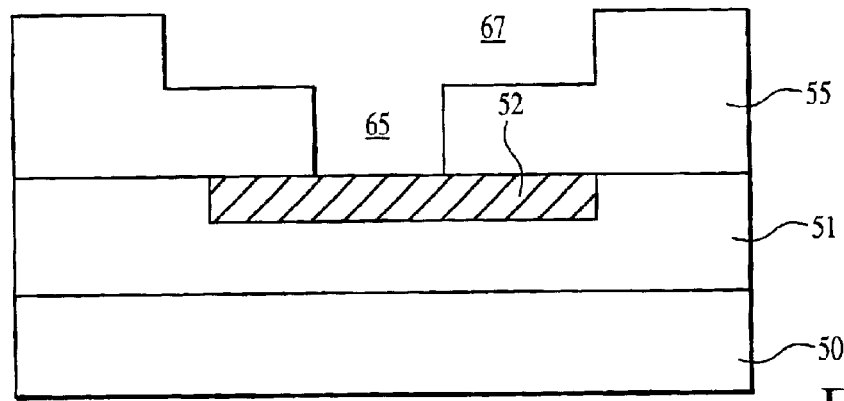
FIG. 10 is a cross-sectional view of the semiconductor device of FIG. 5 at a subsequent stage of production.
Figure 11:
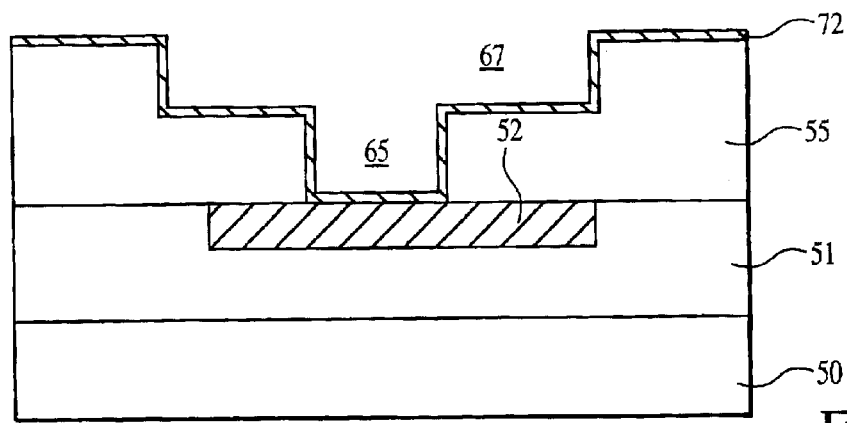
FIG. 11 is a cross-sectional view of the semiconductor device of FIG. 5 at a subsequent stage of production.
Figure 12:
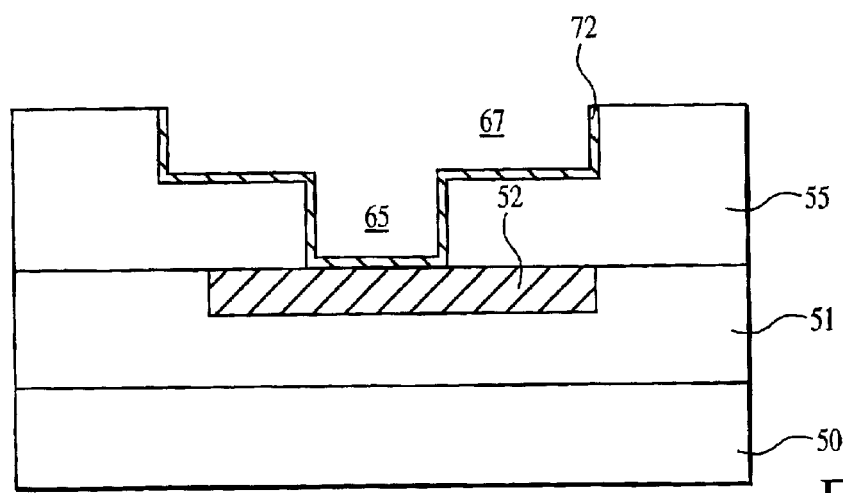
FIG. 12 is a cross-sectional view of the semiconductor device of FIG. 5 at a subsequent stage of production.

After the formation of the via 65 through the intermetal dielectric layer 55, a trench 67 (FIG. 10) is formed by employing a second mask layer 62 (FIG. 9) having images of a trench pattern 63 (FIG. 9) over the intermetal dielectric layer 55. The trench pattern 63 is then etched into the intermetal dielectric layer 55 using the mask layer 62 to form trench 67, as shown in FIG. 10. The etching of the trench 67 may be accomplished using the same etchant employed to form the via 65 (FIG. 8), which according to a preferred embodiment of the invention is a tetra-methyl-ammonium hydroxide (TMAH) solution.

As noted above, if the intermetal dielectric layer 55 is formed of methylsilsesquiazane material and if UV lithography is employed, the methylsilsesquiazane (MSZ) material undergoes curing at 400° C. in a nitrogen ambient to be subsequently transformed into a methylsilsesquioxane (MSQ) film.

Subsequent to the formation of trench 67, the second mask layer 62 is removed so that further steps to create the copper dual damascene structure 100 (FIG. 14) may be carried out. As such, a diffusion barrier layer 72 (FIG. 11) is formed on the via 65 and the trench 67 to a thickness of about 50 Angstroms to about 200 Angstroms, more preferably of about 100 Angstroms.

In a preferred embodiment, the diffusion barrier layer 72 is formed of tungsten nitride ($WN_2$) by a method described by Klaus et al. in *Atomic Layer Deposition of Tungsten Nitride Films Using Sequential Surface Reactions*, J. of Electrochemical Soc., Vol. 147(3), pp. 1175–1181 (2000), the disclosure of which is incorporated by reference herein. Klaus et al. have demonstrated that tungsten nitride films deposited with atomic layer control using sequential surface reactions have a stoichiometry with low carbon (C) and oxygen (O) impurity concentrations which prevent the diffusion of copper at elevated temperatures. According to the atomic layer control using sequential surface reactions technique described by Klaus et al., tungsten nitride films are deposited at a temperature of about 600–800K using an initial treatment of 10 mTorr $Si_2H_6$ at 600K for about 5 minutes on a hydroxilated $SiO_2$ surface. After the initial $Si_2H_6$ treatment, tungsten nitride film growth can be conducted at reactions temperatures between about 550–800K by employing, for example, cycles of $WF_6$ and $NH_3$ to transform the $SiO_2$ surface to a tungsten nitride surface. The tungsten nitride films formed by the above-described atomic layer control using sequential surface reactions technique have a microcrystalline structure and a remarkably flat surface indicating smooth film growth.

Although in a preferred embodiment of the invention the tungsten nitride diffusion barrier layer 72 is simultaneously deposited in both the via 65 and the trench 67 (FIG. 11), the invention is not limited to this embodiment. Thus, the tungsten-nitride diffusion barrier layer 72 may be deposited first in the via 65 before the formation of the trench 67, and then in the trench 67 after its respective formation. In any event, after the formation of the diffusion barrier layer 72, horizontal portions of the tungsten nitride material formed above the surface of the intermetal dielectric layer 55 are removed by a light polishing technique to form the structure illustrated in FIG. 12. In a preferred embodiment of the present invention, a light chemical mechanical polishing (CMP) is used to polish away excess tungsten-nitride material above the intermetal dielectric layer 55 and the trench level. This way, the intermetal dielectric layer 55 acts as a polishing stop layer when light CMP is used.

Figure 13:
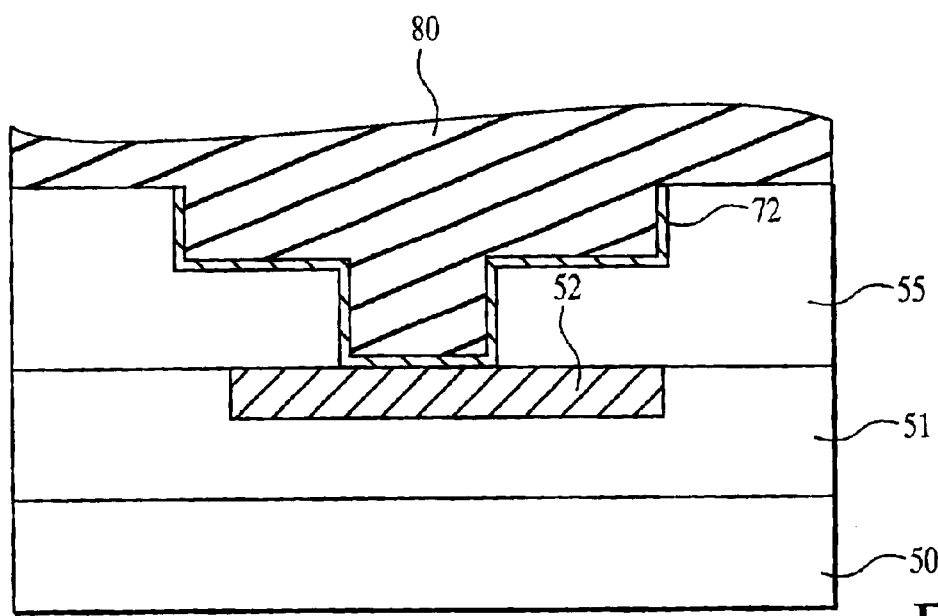
FIG. 13 is a cross-sectional view of the semiconductor device of FIG. 5 at a subsequent stage of production.

As illustrated in FIG. 13, a conductive material 80 comprising copper (Cu) is next deposited to fill in both the via 65 and the trench 67. In an exemplary embodiment, the copper is selectively deposited by CVD as described by Kaloyeros et al. in *Blanket And Selective Copper CVD From $Cu(fod)_2$ For Multilevel Metallization*, Mat. Res. Soc. Symp. Proc., Vol. 181 (1990), the disclosure of which is incorporated by reference herein. Studies of blanket and selective low-temperature metal-organic chemical vapor deposition (LTMOCVD) of copper have been conducted by Kaloyeros et al. at 300–400° C. in an atmosphere of pure $H_2$ or Ar from the β-diketonate precursor bis(6,6,7,8,8,8-heptafluoro-2,2-dimetyl 1-3,5-octanedino) copper (II), Cu $(fod)_2$. According to one selective LTMOCVD technique proposed by Kaloyeros et al., the reactor is first pumped down to a base pressure of less than $5\times10^{-7}$ torr. Subsequently, the source compound is introduced into the sublimator which is heated to 40–75° C. A mass flow controller is employed to control the flow of the mixed gas/precursor into the reactor. Copper deposition is carried out using argon (Ar) and hydrogen ($H_2$) as the carrier gases. The substrate 50 is heated to about 300–400° C., while the pressure during deposition ranges from about 1 torr to about 10 torr, at a gas flow range of about 30 sccm to about 55 sccm.

Figure 14:
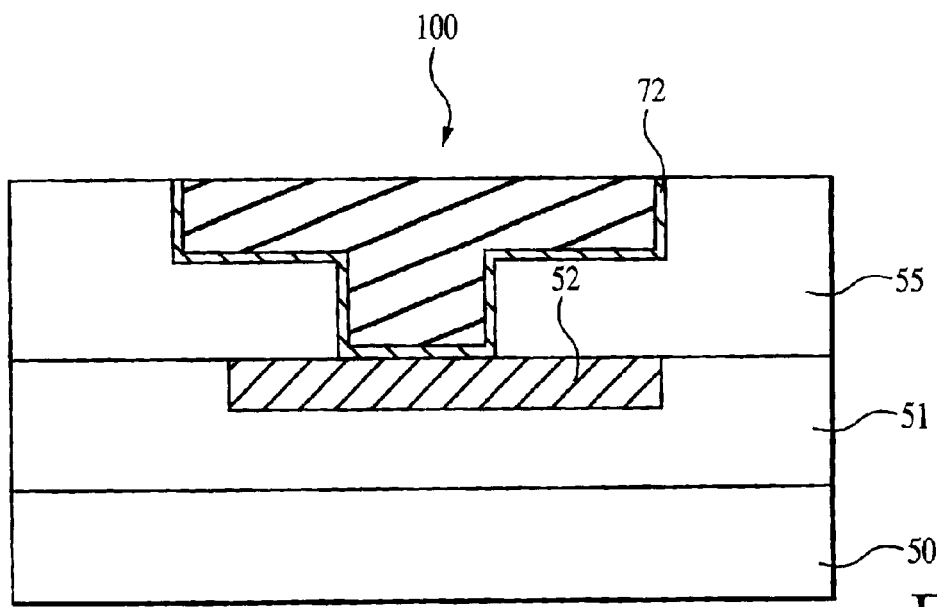
FIG. 14 is a cross-sectional view of the semiconductor device of FIG. 5 at a subsequent stage of production.

After the deposition of the copper material 80, excess copper formed above the surface of the intermetal dielectric layer 55 may be removed by either an etching or a polishing technique to form the copper dual damascene structure 100 illustrated in FIG. 14. In a preferred embodiment of the present invention, chemical mechanical polishing (CMP) is used to polish away excess copper above the intermetal dielectric layer 55 and the trench level. This way, the intermetal dielectric layer 55 acts as a polishing stop layer when CMP is used.

The selective deposition of copper by CVD that was described above is not the only method that could be employed for forming the conductive material 80. For example, according to another embodiment of the invention, copper can be selectively deposited by an electroless plating technique, which is more attractive than conventional electroplating methods. According to studies done by Shacham-Diamand et al. printed in *Copper electroless deposition technology for ultra-large-scale-integration (ULSI) metallization*, Microelectronic Engineering, Vol. 33, pp. 47–58 (1997), the disclosure of which is incorporated by reference herein, elecroless plating has a very high selectivity, excellent step coverage and good via/trench filling because of the very thin seed layers formed by this method. Electroless plating is also more advantageous than electroplating because of the low cost of tools and materials.

Figure 15:
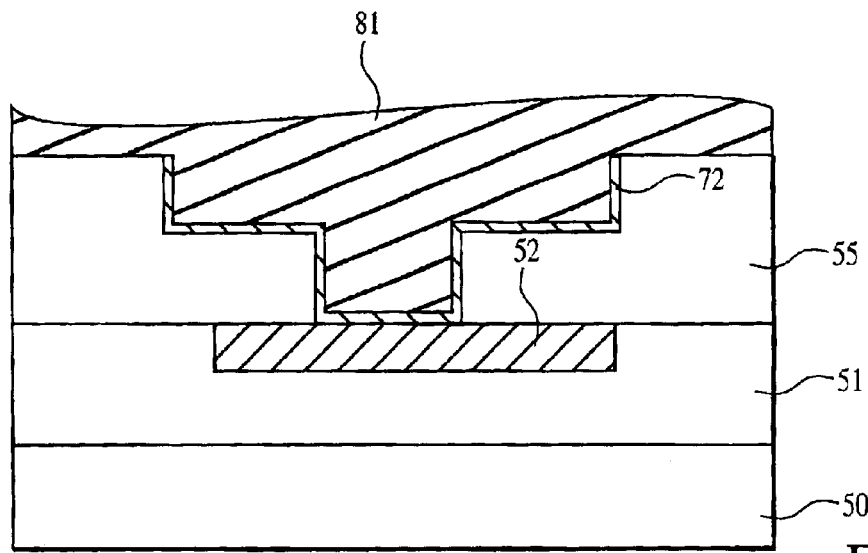
FIG. 15 is a cross-sectional view of a semiconductor device constructed in accordance with a second embodiment of the present invention.

According to Shacham-Diamand et al., three practical seeding methods for the electroless deposition of copper could be used: (1) noble metal seeding, typically on gold, palladium or platinum; (2) copper seeding using an aluminum sacrificial layer; and (3) wet activation of surfaces using a contact displacement method. Shacham-Diamand et al. have successfully used the third method to deposit copper on Ti/TiN or TiN/AlCu at room temperature. Accordingly, in an exemplary embodiment of the present invention, contact displacement copper deposition is used to first selectively activate the tungsten nitride diffusion barrier layer 72, after which selective electroless copper deposition is employed to obtain a copper layer 81 (FIG. 15). Copper deposition by contact displacement offers the advantage of room temperature, which in turn allows many low dielectric constant organic and/or inorganic materials to be used as the material of choice for interlayer dielectrics, such as the intermetal dielectric layer 55.

Figure 16:
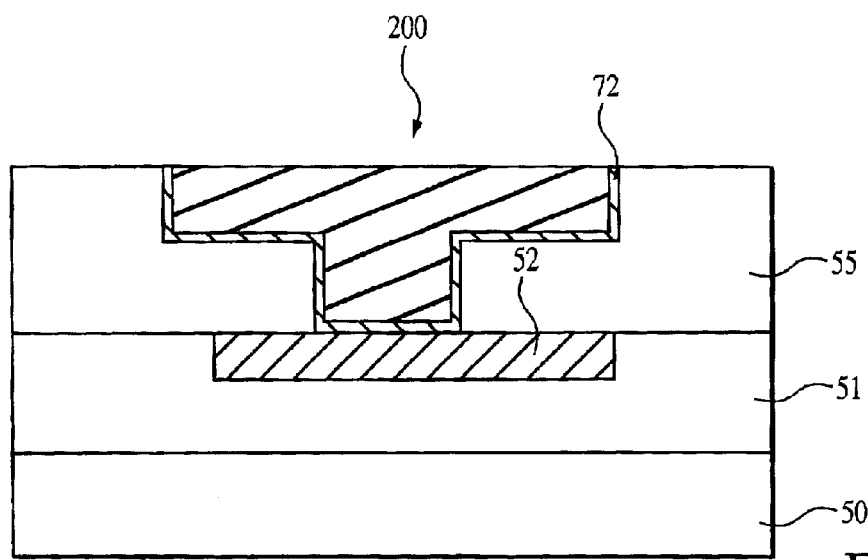
FIG. 16 is a cross-sectional view of the semiconductor device of FIG. 15 at a subsequent stage of production.

After the deposition of the copper material 81 (FIG. 15), excess copper formed above the surface of the intermetal dielectric layer 55 may be removed by either an etching or a polishing technique to form a copper dual damascene structure 200 illustrated in FIG. 16. In a preferred embodiment of the present invention, chemical mechanical polishing (CMP) is used to polish away excess copper above the intermetal dielectric layer 55 and the trench level. This way, the intermetal dielectric layer 55 acts as a polishing stop layer when CMP is used.

Figure 17:
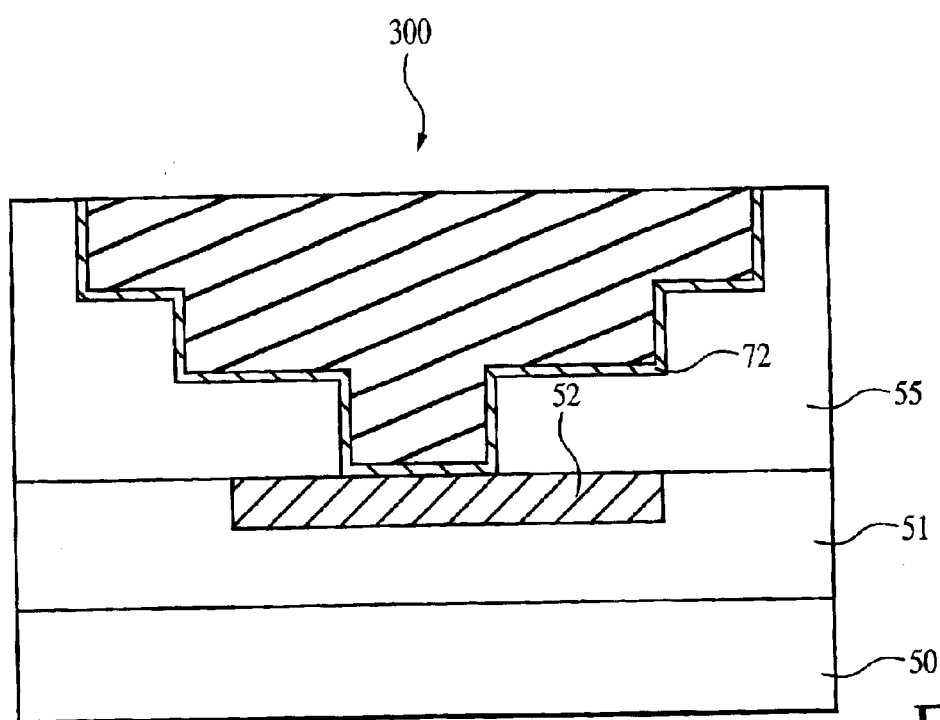
FIG. 17 is a cross-sectional view of a semiconductor device constructed in accordance with a third embodiment of the present invention.

Although only one copper dual damascene structure 100, 200 is shown in FIG. 14 and FIG. 16, respectively, it must be readily apparent to those skilled in the art that in fact any number of such copper dual damascene structures may be formed on the substrate 50. Also, although the exemplary embodiments described above refer to the formation of a copper dual damascene structure 100, 200, the invention is further applicable to other types of damascene structures, for example triple damascene structures, as long as they include a tungsten nitride diffusion barrier layer and copper selectively deposited by the methods described in detail above. For example, FIG. 17 illustrates a triple damascene structure 300 formed within the intermetal dielectric layer 55 and over the substrate 50, and in which vias and trenches are filled simultaneously with the selectively deposited copper by the methods described above.

In addition, further steps to create a functional semiconductor circuit structure may be carried out. Thus, additional multilevel interconnect layers and associated dielectric layers could be formed to create operative electrical paths from any of the copper damascene structures 100, 200, 300 to appropriate regions of a circuit intergated on substrate 50.

Figure 18:
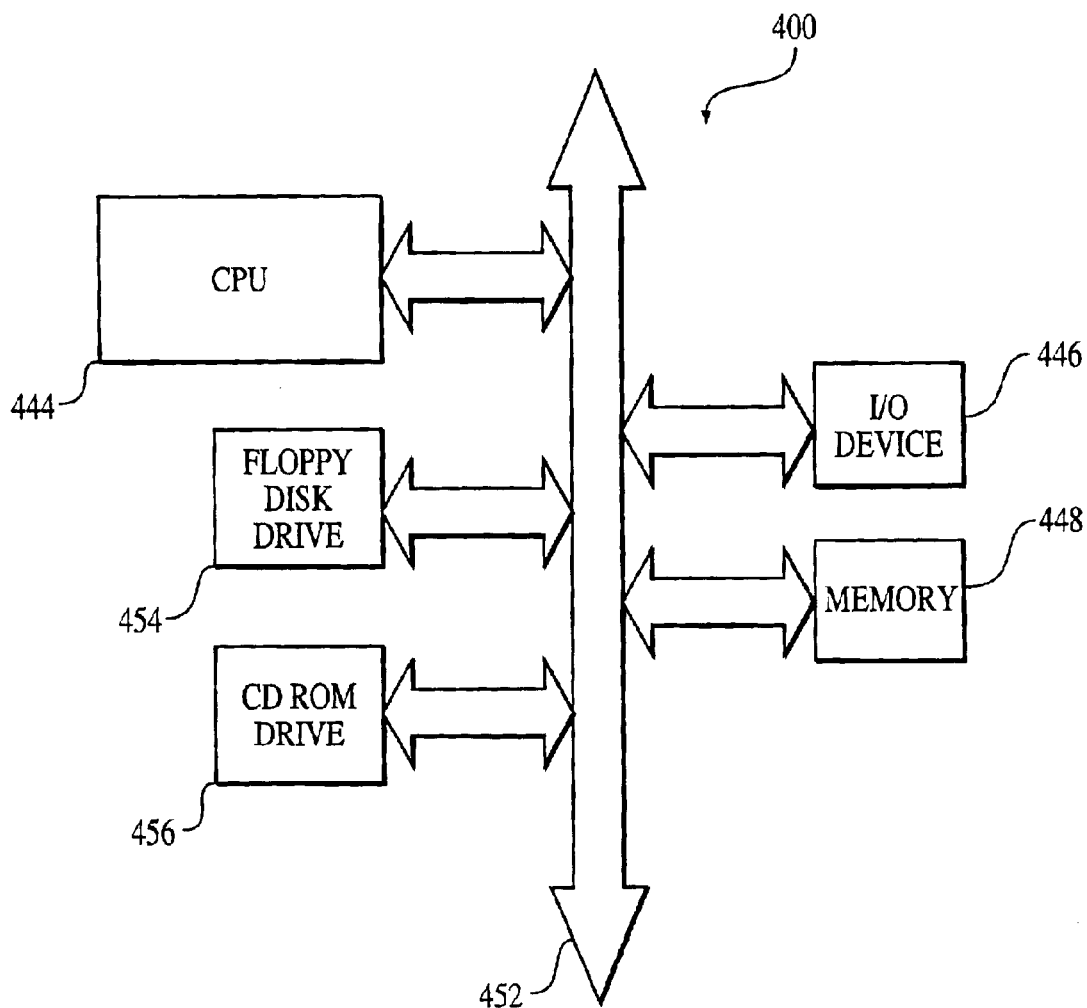
FIG. 18 illustrates a computer system having a memory cell with a copper damascene structure according to the present invention.

The interconnect structure of the invention may be used in the upper layer metallization patterns of many integrated circuit devices including, but not limited to, memory devices and processors. FIG. 18 illustrates a typical processor-based system 400 which includes a memory circuit 448, for example a DRAM memory circuit employing a plurality of DRAM memory devices. One or both of central processing unit (CPU) 444 and the DRAM memory device may contain damascene structures, such as the copper damascene structures 100, 200, 300 fabricated according to the present invention. A processor system, such as a computer system, generally comprises the central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes one or more copper damascene structures 100, 200, 300. If desired, the memory 448 may be combined with the processor, for example CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming a copper damascene structure, said method comprising the steps of:
   providing a metal layer within a semiconductor substrate;
   forming a low-dielectric constant layer over and in contact with said metal layer;
   directly patterning said low-dielectric constant layer to form at least one opening through said low-dielectric constant layer, said opening extending to at least a portion of said metal layer;
   forming a tungsten nitride layer by atomic-layer deposition using sequential surface reactions, said tungsten nitride layer being in contact with said at least one opening;
   removing horizontal portions of said tungsten nitride layer formed above a surface of said low-dielectric constant layer by chemical mechanical polishing; and
   subsequently providing a copper layer in said at least one opening and in contact with said tungsten nitride layer, wherein said copper layer is selectively deposited by low-temperature metal-organic chemical vapor deposition.

2. The method of claim 1, wherein said low-dielectric constant layer includes a material selected from the group consisting of methylsilsequiazane, polyimide, spin-on-polymers, flare, polyarylethers, parylene, polytetrafluoroethylene, benzocyclobutene, fluorinated silicon oxide, and hydrogen silsesquioxane.

3. The method of claim 1, wherein said low-dielectric constant layer comprises methylsilsequiazane.

4. The method of claim 3, wherein said step of forming said at least one opening further comprises patterning said methylsilsequiazane layer with a mask.

5. The method of claim 4, wherein said step of patterning said low-dielectric constant layer further comprises exposing said low-dielectric constant layer to an electron beam or ultra violet light.

6. The method of claim 5, wherein said step of forming said at least one opening further comprises etching said low-dielectric constant layer with a tetra-methyl-ammonium hydroxide solution.

7. The method of claim 3, wherein said low-dielectric constant layer is formed by spin coating to a thickness of about 2,000 to 50,000 Angstroms.

8. The method of claim 7, wherein said low-dielectric constant layer is formed by spin coating to a thickness of about 5,000 to 20,000 Angstroms.

9. The method of claim 1, wherein said tungsten nitride layer is formed at a temperature of about 550–800K.

10. The method of claim 1, wherein said copper layer is selectively deposited at a temperature of about 300° C. to about 400° C.

11. The method of claim 10, wherein said copper layer is selectively deposited in an atmosphere of pure hydrogen from the β-diketonate precursor bis(6,6,7,8,8,8-heptafluoro-2,2-dimetyl 1-3,5-octanedino) copper (II).

12. The method of claim 10, wherein said copper layer is selectively deposited in an atmosphere of pure argon from the β-diketonate precursor bis(6,6,7,8,8,8-heptafluoro-2,2-dimetyl 1-3,5-octanedino) copper (II).

13. A method of forming a copper damascene structure, said method comprising the steps of:
   directly patterning a low-dielectric constant layer with a mask to form at least one opening through said low-dielectric constant layer;
   forming a tungsten nitride layer by atomic-layer deposition using sequential surface reactions, said tungsten nitride layer being in contact with said at least one opening, said tungsten nitride layer being formed above and in contact with a top surface of said low-dielectric constant layer;
   removing horizontal portions of said tungsten nitride layer formed above and in contact with said top surface of said low-dielectric constant layer by chemical mechanical polishing; and
   subsequently providing a copper layer in said at least one opening, wherein said copper layer is formed by contact displacement copper deposition at room temperature.

14. The method of claim 1 further comprising the act of chemical mechanical polishing said copper layer.

15. A method of forming a copper damascene structure, said method comprising the steps of:
   forming a material layer of methylsilsequiazane over a substrate;
   forming at least one opening through said methylsilsequiazane layer by etching said methylsilsequiazane layer with a tetra-methyl-ammonium hydroxide solution;
   forming a tungsten nitride layer by atomic-layer deposition using sequential surface reactions, said tungsten nitride layer being in contact with said at least one opening;

removing horizontal portions of said tungsten nitride layer formed above and in contact with a top surface of said methylsilsequiazane layer; and subsequently providing a copper layer in said at least one opening.

16. The method of claim 15, wherein said step of forming said at least one opening further comprises directly patterning said methylsilsequiazane layer with a mask to form said at least one opening.

17. The method of claim 16, wherein said step of directly patterning said methylsilsequiazane layer further comprises exposing said methylsilsequiazane layer to an electron beam or ultra violet light.

18. The method of claim 15, wherein said methylsilsequiazane layer is formed by spin coating to a thickness of about 2,000 to 50,000 Angstroms.

19. The method of claim 18, wherein said methylsilsequiazane layer is formed by spin coating to a thickness of about 5,000 to 20,000 Angstroms.

20. The method of claim 15, wherein said tungsten nitride layer is formed at a temperature of about 550–800K.

21. The method of claim 15, wherein said copper layer is selectively deposited by chemical vapor deposition.

22. The method of claim 21, wherein said copper layer is selectively deposited at a temperature of about 300° C. to about 400° C.

23. The method of claim 22, wherein said copper layer is selectively deposited in an atmosphere of pure hydrogen from the β-diketonate precursor bis(6,6,7,8,8,8-heptafluoro-2,2-dimetyl 1-3,5-octanedino) copper (II).

24. The method of claim 22, wherein said copper layer is selectively deposited in an atmosphere of pure argon from the β-diketonate precursor bis(6,6,7,8,8,8-heptafluoro-2,2-dimetyl 1-3,5-octanedino) copper (II).

25. The method of claim 15, wherein said copper layer is formed by electroless deposition.

26. The method of claim 15 further comprising the act of chemical mechanical polishing said tungsten nitride layer.

27. The method of claim 15 further comprising the act of chemical mechanical polishing said copper layer.

28. A method of forming a copper damascene structure, said method comprising the steps of:

providing a metal layer within a semiconductor substrate;

forming a low-dielectric constant layer over and in contact with said metal layer;

directly patterning said low-dielectric constant layer to form at least one opening through said low-dielectric constant layer, said opening extending to at least a portion of said metal layer;

forming a tungsten nitride layer by atomic-layer deposition using sequential surf ace reactions, said tungsten nitride layer being in contact with said at least one opening;

removing horizontal portions of said tungsten nitride layer formed above a surface of said low-dielectric constant layer by chemical mechanical polishing; and subsequently providing a copper layer in said at least one opening and in contact with said tungsten nitride layer, wherein said copper layer is selectively deposited by low-temperature metal-organic chemical vapor deposition;

wherein said low-dielectric constant layer includes a material selected from the group consisting of methylsilsequiazane, polyimide, spin-on-polymers, flare, polyarylethers, parylene, polytetrafluoroethylene, benzocyclobutene, fluorinated silicon oxide, and hydrogen silsesquioxane;

wherein said copper layer is selectively deposited at a temperature of about 300° C. to about 400° C. in an atmosphere from the β-diketonate precursor bis(6,6,7,8,8,8-heptafluoro-2,2-dimetyl 1-3,5-octanedino) copper (II); and wherein the atmosphere is a pure gas selected from the group consisting of hydrogen and argon.

* * * * *